United States Patent
Matsuo et al.

(10) Patent No.: US 7,485,204 B2
(45) Date of Patent: Feb. 3, 2009

(54) ECR PLASMA SOURCE AND ECR PLASMA DEVICE

(75) Inventors: Seitaro Matsuo, Mitaka (JP); Toshiyuki Nozaki, Mitaka (JP); Fumio Tanaka, Mitaka (JP)

(73) Assignee: MES AFTY Corporation, Tokyo (JP)

( * ) Notice: Subject to any disclaimer, the term of this patent is extended or adjusted under 35 U.S.C. 154(b) by 98 days.

(21) Appl. No.: 10/510,479

(22) PCT Filed: Apr. 9, 2003

(86) PCT No.: PCT/JP03/04481

§ 371 (c)(1),
(2), (4) Date: Oct. 7, 2004

(87) PCT Pub. No.: WO03/086032

PCT Pub. Date: Oct. 16, 2003

(65) Prior Publication Data

US 2005/0145339 A1    Jul. 7, 2005

(30) Foreign Application Priority Data

Apr. 9, 2002 (JP) .............................. 2002-106710

(51) Int. Cl.
*C23C 16/00* (2006.01)
*C23F 1/00* (2006.01)
*H01L 21/306* (2006.01)

(52) U.S. Cl. .................... 156/345.41; 156/345.36; 156/345.42; 156/345.46; 118/723 MW (58) Field of Classification Search ......... 118/723 MW; 156/345.62
See application file for complete search history.

(56) References Cited

U.S. PATENT DOCUMENTS

| 4,893,584 A | 1/1990 | Doehler et al. |
| 5,306,379 A * | 4/1994 | Kamide ................. 156/345.42 |

(Continued)

FOREIGN PATENT DOCUMENTS

EP    0 578047    1/1994

(Continued)

OTHER PUBLICATIONS

Amazawa et al., "Deposition of High Quality Thin Films Using ECR Plasma", Reports of Precision Engineering Society, vol. 66, No. 4, pp. 511-516, 2000.

(Continued)

*Primary Examiner*—Parviz Hassanzadeh
*Assistant Examiner*—Rakesh K Dhingra
(74) *Attorney, Agent, or Firm*—Dickstein Shapiro LLP (57) ABSTRACT

An ECR plasma source of the invention is constructed of: a plasma generating chamber (10) having a generally rectangular section in a plane normal to a plasma flow; magnetic coils (20, 21) wound in generally rectangular shapes in a plane normal to the plasma flow; and a direct introduction type or branching and binding introduction type waveguide (30) or microwave cavity resonator. Microwaves are transmitted into the plasma generating chamber (10) from a plurality of openings (34) which are formed in such side faces in the waveguide (30) or the microwave cavity resonator as correspond to in-phase microwave portions. Moreover, an ECR plasma device comprises the aforementioned ECR plasma source and a sample moving mechanism for moving a large-sized sample.

7 Claims, 5 Drawing Sheets

U.S. PATENT DOCUMENTS

| | | | |
|---|---|---|---|
| 5,328,515 A | | 7/1994 | Chouan et al. |
| 5,389,154 A | * | 2/1995 | Hiroshi et al. ....... 118/723 MR |
| 5,707,452 A | * | 1/1998 | Dandl ................ 118/723 MW |
| 5,843,236 A | * | 12/1998 | Yoshiki et al. ....... 118/723 MR |
| 5,961,851 A | * | 10/1999 | Kamarehi et al. ............. 216/69 |
| 5,975,014 A | * | 11/1999 | Dandl ................ 118/723 MW |
| 6,169,466 B1 | * | 1/2001 | Goulouev ................... 333/210 |
| 6,246,175 B1 | * | 6/2001 | Kou et al. ............... 315/111.21 |
| 6,463,874 B1 | * | 10/2002 | Dotter et al. ........ 118/723 MW |
| 2001/0011525 A1 | | 8/2001 | Ishii |

FOREIGN PATENT DOCUMENTS

| | | |
|---|---|---|
| EP | 0 702 393 | 3/1996 |
| EP | 0 739 155 | 10/1996 |
| EP | 1 032 097 | 8/2000 |
| JP | 59-047728 | 3/1984 |
| JP | 62-152127 | 7/1987 |
| JP | 62-200730 | 9/1987 |
| JP | 62-229841 | 10/1987 |
| JP | 1-134926 | 5/1989 |
| JP | 2-11772 | 1/1990 |
| JP | 3-130369 | 6/1991 |
| JP | 04-358076 A | 12/1992 |
| JP | 6-53152 | 2/1994 |
| JP | 2001-223098 | 8/2001 |
| KR | 10-0197113 | 3/1997 |

OTHER PUBLICATIONS

Hiroshi Nishimura, et al., "Processing Uniformity Improvement by Magnetic Field Distribution Control in Electron Cyclotron Resonance Plasma Chamber", The Japan Society of Applied Physics, Extended Abstracts of the 1992 International Conference on Solid State Devices and Materials, 1992, pp. 43-45.

Jes Asmussen, Jr. et al., "The Design and Application of Electron Cyclotron Resonance Discharges," *IEEE Transactions on Plasma Science*, vol. 25, No. 6, Dec. 1997, pp. 1196-1221.

Korean Office Action mailed Jan. 26, 2007, Korean Patent Application No. 10-2004-7015840, with translation.

Korean Office Action mailed Jan. 26, 2007, Korean Patent Application No. 10-2004-7015840, with translation.

Jes Asmussen, Jr. et al., "The Design and Application of Electron Cyclotron Resonance Discharges," *IEEE Transactions on Plasma Science*, vol. 25, No. 6, Dec. 1997, pp. 1196-1221.

* cited by examiner

ECR PLASMA SOURCE AND ECR PLASMA DEVICE

TECHNICAL FIELD

The present invention relates to an ECR plasma source and an ECR plasma device and, more particularly, to an ECR plasma source capable of establishing a plasma density uniform in a generally rectangular section, and an ECR plasma device using the source.

BACKGROUND ART

The ECR (Electron Cyclotron Resonance) plasma source can generate a highly dense plasma uniformly in a plasma generating chamber so that it is used as a plasma source for a semiconductor laser, an SAW (Surface Acoustic Wave) device, or a device for sputtering or etching an LSI.

The ECR plasma source comprises a plasma generating chamber, a magnetic coil and a microwave introducing portion. The ECR sputtering or etching device of the prior art has been intended mainly for a wafer-shaped circular sample placed still. Therefore, the ECR plasma source for those device comprises: a plasma generating chamber having a circular sectional shape in a plane normal to a plasma flow; a magnetic coil wound to have a circular sectional shape in a plane normal to the plasma flow; and a microwave introducing portion having a structure for introducing the microwaves either directly or in a branching and binding method from a microwave waveguide (as referred to Japanese Patent Application Publication No. 01-036693 (1989) (Japanese Patent No. 1553959 or "Deposition of High Quality Thin Films Using ECR Plasma" by Amazawa et al., Reports of Precision Engineering Society Vol. 66, No. 4, 511 (2000).

Especially in the case of the sputtering device, the branching and binding method is frequently utilized so as to prevent target particles from contaminating a microwave introducing aperture (usually made of a quartz plate).

Figure 5A:
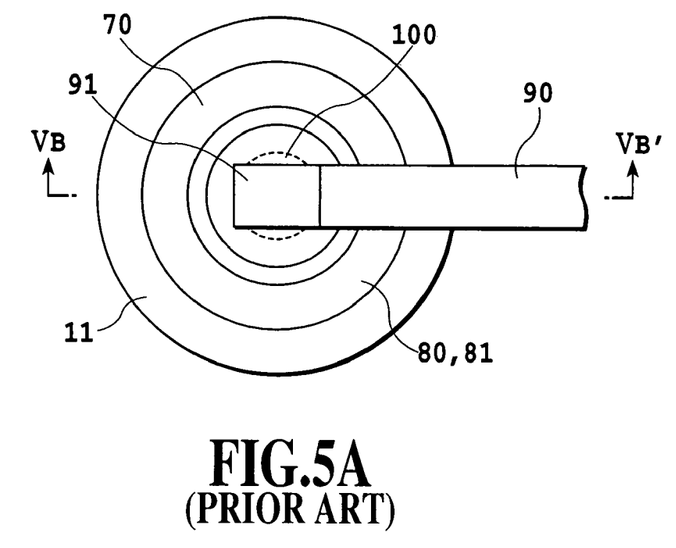
FIG. 5A is a top plan view.
Figure 5B:
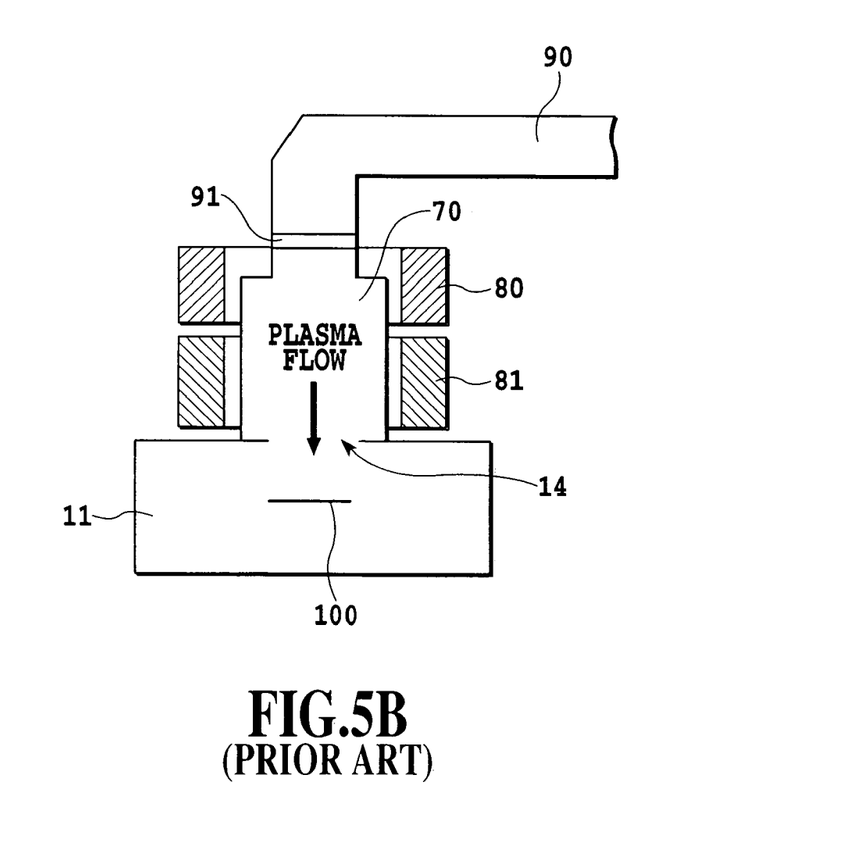
FIG. 5B is a sectional view taken along VB-VB' from FIG. 5A.

FIG. 5A and FIG. 5B are diagrams for explaining an example of the construction of an etching device, which comprises the ECR plasma source of the prior art having a circular section. FIG. 5A is a top plan view, and FIG. 5B is a sectional view taken along VB-VB' from FIG. 5A.

In the etching device comprising the ECR plasma source of the prior art having the construction shown in FIG. 5A and FIG. 5B, the plasma generated in a plasma generating chamber 70 flows through a plasma drawing opening 14 and irradiates a sample 100 arranged in a sample chamber 11. In this case, the plasma generated in the plasma generating chamber 70 establishes a downward plasma flow directed from the plasma generating chamber 70 to the sample 100, as shown in FIG. 5B.

Considering the shape of the sample 100 to be treated, the plasma generating chamber 70 is shaped to have a circular sectional shape in a plane normal to that plasma flow. On the other hand, magnetic coils 80 and 81 are wound in a circular shape in a plane normal to the plasma flow, and are designed to establish a magnetic field for the ECR conditions at a predetermined position in the plasma generating chamber 70. Microwaves are introduced into the plasma generating chamber 70 from a microwave guide 90 through a microwave introducing aperture 91 (usually utilizing a quartz aperture) so that electrons in the magnetic field are efficiently accelerated by the vibrating electric field of the microwaves.

In the so-called "FPD (Flat Panel Display) device" such as a liquid crystal display, a plasma display or an organic EL (Electro Luminescence) display, the development of which has been progressed, the sputtering or etching treatment is demanded for a large-sized sample of about 50 cm×60 cm.

In order that this treatment may be coped with the ECR plasma source of the prior art in which the plasma generating chamber has the circular section in the plane normal to the plasma flow, however, the ECR plasma source has to be diametrically enlarged. In this case, there arise problems: (1) the plasma generating chamber and the magnetic coil are enlarged to make the ECR plasma source extremely expensive; and (2) in the ECR plasma source having the circular section, it is difficult to sputter or etch the large-sized generally rectangular FPD sample uniformly.

DISCLOSURE OF THE INVENTION

The present invention has been conceived in view of those problems, and has an object to provide an ECR plasma source which can make a plasma density uniform in a generally rectangular section, and an ECR plasma device using the source.

In order to achieve such object, according to a first aspect of the invention, there is provided an ECR plasma source comprising: a plasma generating chamber for generating a plasma using the electron cyclotron resonance (ECR) by microwaves and for drawing a plasma flow from an opening; at least one magnetic generation means having magnetic coils wound for generating magnetostatic fields in the plasma generating chamber; and microwave introducing means for introducing the microwaves transmitted from microwave transmitting means, into the plasma generating chamber, characterized: in that the plasma generating chamber and the opening of the plasma generating chamber have generally rectangular sectional shapes normal to the direction of the plasma flow generated in the plasma generating chamber; in that the magnetic coils of the magnetic generation means are wound in generally rectangular shapes in a plane normal to the direction of the plasma flow; and in that the microwave introducing means is so terminated at the end portion as to construct a hollow waveguide for forming standing waves of microwaves in the microwave introducing means, and in that a plurality of open areas having at least one opening are disposed in the waveguide at an interval corresponding to the guide wavelength λg of the standing waves of the microwaves, so that microwaves in phase are introduced through the opening into the plasma generating chamber.

According to a second aspect of the invention, there is also provided an ECR plasma source comprising: a plasma generating chamber for generating a plasma using the electron cyclotron resonance (ECR) by microwaves and for drawing a plasma flow from an opening; at least one magnetic generation means having magnetic coils wound for generating magnetostatic fields in the plasma generating chamber; and microwave introducing means for introducing the microwaves transmitted from microwave transmitting means, into the plasma generating chamber, characterized: in that the plasma generating chamber and the opening of the plasma generating chamber have generally rectangular sectional shapes normal to the direction of the plasma flow generated in the plasma generating chamber; in that the magnetic coils of the magnetic generation means are wound in generally rectangular shapes in a plane normal to the direction of the plasma flow; and in that the microwave introducing means constructs a microwave cavity resonator between a terminal end portion having no opening and an end portion having a first opening disposed at a distance of n×(λg/2) (n: an integer of 3 or more) from the terminal end portion, in that a plurality of open areas having at least one second opening are disposed in the microwave cavity resonator at an interval corresponding to the guide wavelength λg of the standing waves of the microwaves, so that microwaves in phase are introduced through the second opening into the plasma chamber.

According to a third aspect of the invention, the aforementioned ECR plasma source is characterized in that the microwave introducing means includes microwave branching means for branching and binding the microwaves transmitted from the microwave transmitting means.

The ECR plasma device of the invention is characterized by comprising the ECR plasma source of the aforementioned invention. Moreover, this ECR plasma device can comprise sample moving means so that a sample may be irradiated at the generally rectangular area of the surface of the sample while being moved by the sample moving means.

BRIEF DESCRIPTION OF THE DRAWINGS

FIG. 1A and FIG. 1B are diagrams for explaining the constructions of an ECR plasma source according to a first embodiment of the invention and an ECR plasma device (e.g., an etching device or a CVD device) comprising the ECR plasma source.

FIG. 2A and FIG. 2B are diagrams for explaining other examples of the constructions of the ECR plasma source according to the first embodiment of the invention and the ECR plasma device (e.g., the etching device or the CVD device) comprising the ECR plasma source.

FIG. 3A and FIG. 3B are diagrams for explaining the constructions of an ECR plasma source according to a second embodiment of the invention and a sputtering device comprising the ECR plasma source.

FIG. 5A and FIG. 5B are diagrams for explaining the construction of the etching device comprising the ECR plasma source having the circular section of the prior art.

BEST MODE FOR CARRYING OUT THE INVENTION

An ECR plasma source and an ECR plasma device of the invention will be described in detail with reference to the accompanying drawings.

First Embodiment

Figure 1A:
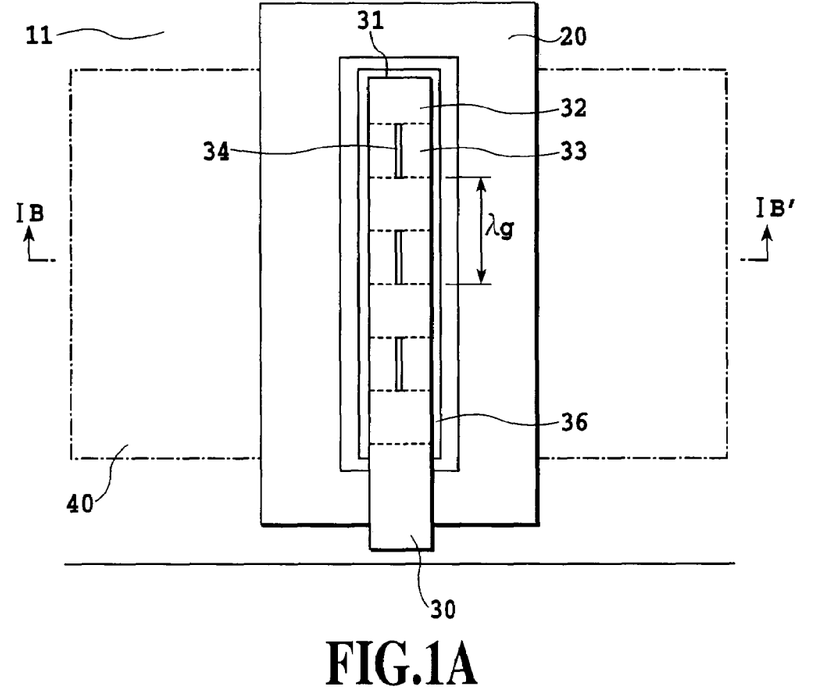
FIG. 1A is a top plan view of the device.
Figure 1B:
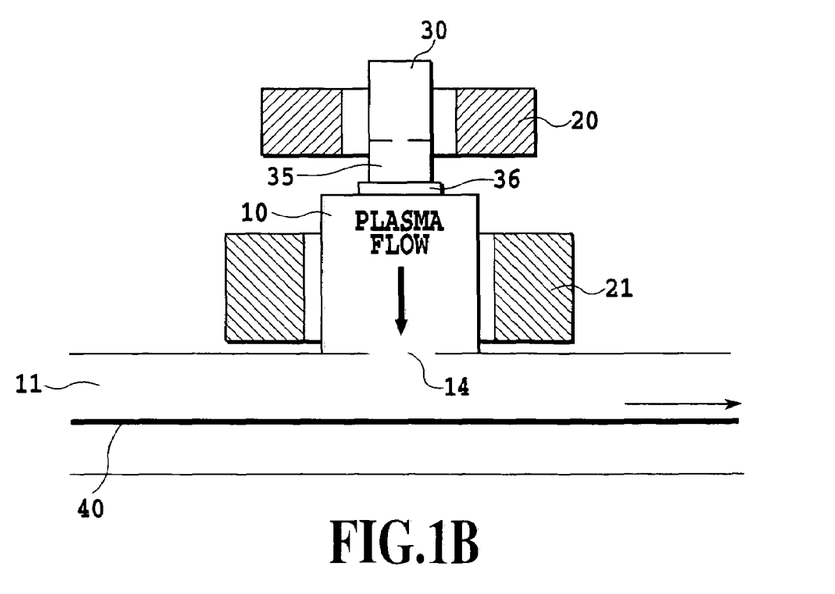
FIG. 1B is a sectional view taken along IB-IB' from FIG. 1A.

FIG. 1A and FIG. 1B are diagrams for explaining the constructions of an ECR plasma source according to a first embodiment of the invention and an ECR plasma device (e.g., an etching device or a CVD (Chemical Vapor Deposition) device) comprising the ECR plasma source. FIG. 1A is a top plan view of the device, and FIG. 1B is a sectional view taken along IB-IB' from FIG. 1A.

The ECR plasma source comprises: a plasma generating chamber 10; magnetic coils 20 and 21 of a magnetic generator; and a microwave introducing portion 30. The plasma, which is generated in the plasma generating chamber 10, is accelerated in the plasma generating chamber 10 so that a plasma flow to a sample chamber 11 through a plasma drawing opening 14 is generated to irradiate a sample 40 arranged in the sample chamber 11. In order to treat the whole surface of the large-sized sample such as the FPD, this embodiment is provided with the not-shown sample moving mechanism, by which the sample 40 is moved in the sample chamber 11 at a predetermined speed in the direction of arrow to be treated so that it is treated all over its surface.

The plasma generating chamber 10 generates the plasma by using the ECR so that the plasma flow may be drawn from the plasma drawing opening 14 or the opening of the plasma generating chamber 10. Both the plasma generating chamber 10 and the plasma drawing opening 14 are given a generally rectangular section shape normal to a direction of the plasma flow to be generated in the plasma generating chamber 10, so that a generally rectangular area irradiated with the plasma flow can be formed on the sample 40.

Here, the "generally rectangular" shape, as will be used throughout herein, implies not only the intrinsic rectangular shape but also widely shapes similar to the rectangular shape. For example, the generally rectangular shape may be a shape having its four corners properly rounded. Moreover, no especial restriction is exerted on the ratio between the longer sides and the shorter sides forming the contour of that shape. In addition, the generally rectangular shape can contain a shape having four sides of an equal length. It is needless to say that what the generally rectangular shape is formed into can be suitably set according to the specifications of the device, which are determined on the basis of the size of the sample to be treated by the ECR plasma device of the invention, the contents of the treatment and so on.

The magnetic coils 20 and 21 of the magnetic generator for generating static magnetic fields in the plasma generating chamber 10 are wound in the generally rectangular shape in a plane normal to the direction of the plasma flow, so that they generate magnetic fields for the ECR conditions at a predetermined position in the plasma generating chamber 10.

The microwaves are introduced into the plasma generating chamber 10 from the microwave introducing portion 30 through a microwave introducing aperture 36 made of quartz or the like, so that electrons in the magnetic field are efficiently accelerated by the vibrating electric field of the microwaves. The microwaves, which are generated by the not-shown microwave source (utilizing the magnetron tube or the like), are transmitted to that microwave introducing portion 30 through an isolator, a matching device or the like.

The microwave introducing portion 30 constructs a hollow waveguide for forming a standing wave of the microwave therein. A plurality of openings 34 (in a slit shape, as shown) are located in series at an interval corresponding to the guide wavelength λg of the standing microwaves in its longitudinal direction in the waveguide having a terminal end portion 31 at its end face. In the structure of the microwave introducing portion 30, the microwaves in an arranged phase (or in phase) are transmitted from this transmission portion 35 into the plasma generating chamber 10.

In the waveguide of this microwave introducing portion 30, more specifically, resonance units 32 having a length λg/2 but not having the openings 34 in the side and resonance units 33 having a length of λg/2 and having a length the opening 34 in the side are alternately arranged sequentially from the terminal end portion 31. The standing waves, which are formed in the resonance units 33 of the length λg/2 and with the opening 34 in the side, are arranged in their phases. Therefore, only these microwaves in phase are introduced into the plasma generating chamber 10 through the openings 34, the microwave transmission portion 35 and the microwave introducing aperture 36, so that the ECR plasma having a uniform plasma density can be generated at a predetermined position in the generally rectangular plasma generating chamber 10.

In the example of the construction described herein, the waveguide of the microwave introducing portion 30 for forming the standing waves has a total length of 3.5 times as large as $\lambda g$. However, it is needless to say that the total length of the waveguide can be freely set according to the size of the sample to be treated. It is also needless to say that the numbers of turns and the current values of the magnetic coils 20 and 21 may be designed to generate the magnetic fields for the ECR conditions at the predetermined position of the plasma generating chamber 10, and that one or more magnetic coils can be used.

In case the ECR plasma device having the construction shown in FIG. 1A and FIG. 1B is practiced as the etching device, the sample of Si or the like can be easily etched by introducing an etching gas such as $SF_6$ or $CF_4$ from the not-shown gas introduction port into the plasma generating chamber 10. Moreover, performing the etching a large-sized sample while moving it at a predetermined speed allows all over the surface of the sample of a large area.

In case the ECR plasma device having the construction shown in FIG. 1A and FIG. 1B is practiced as the CVD device, the film of $SiO_2$ (silicon oxide), $Si_3N_4$ (silicon nitride), $SiO_xN_y$ (silicon oxide-nitride) or the like can be uniformly formed by introducing a gas of $SiH_4$, $O_2$, $N_2$ or the like from the not-shown gas introduction port into the plasma generating chamber 10.

Here, the microwave introducing portion 30 of the ECR plasma source shown in FIG. 1A and FIG. 1B is constructed of the hollow waveguide which is terminated at its end portion for forming the standing microwaves therein. However, the construction of the microwave introducing portion 30 should not be limited to that but may be exemplified by a microwave cavity resonator.

On the other hand, the shape of the openings 34 should not be limited to the slit shape but can be suitably designed if it can introduce the microwaves in phase into the plasma generating chamber 10.

In addition to the method of arranging the openings 34 at every guide wavelengths $\lambda g$ of the standing microwaves, moreover, open areas having a plurality of openings of a suitable shape may be disposed at every intervals corresponding to the guide wavelength $\lambda g$ of the standing microwaves.

Figure 2A:
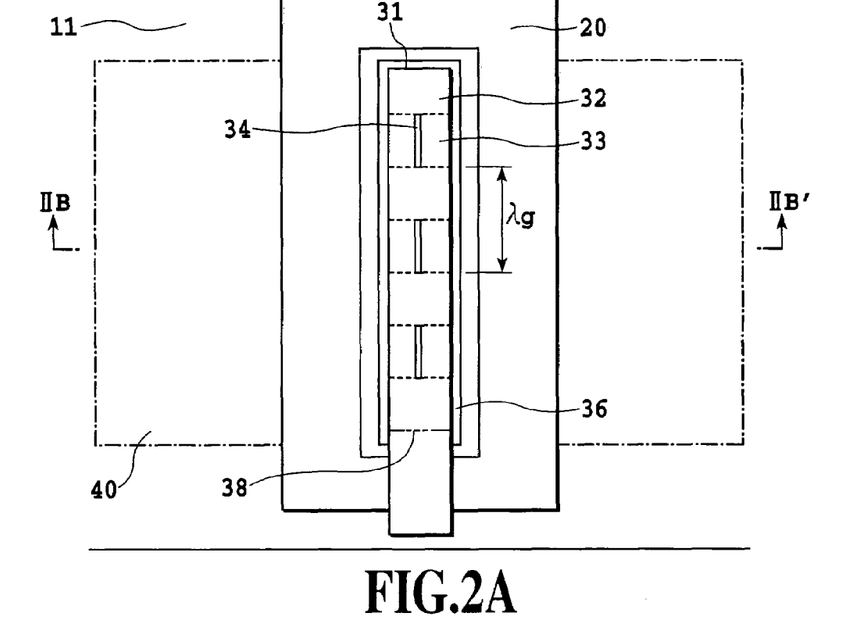
FIG. 2A is a top plan view of the device.
Figure 2B:
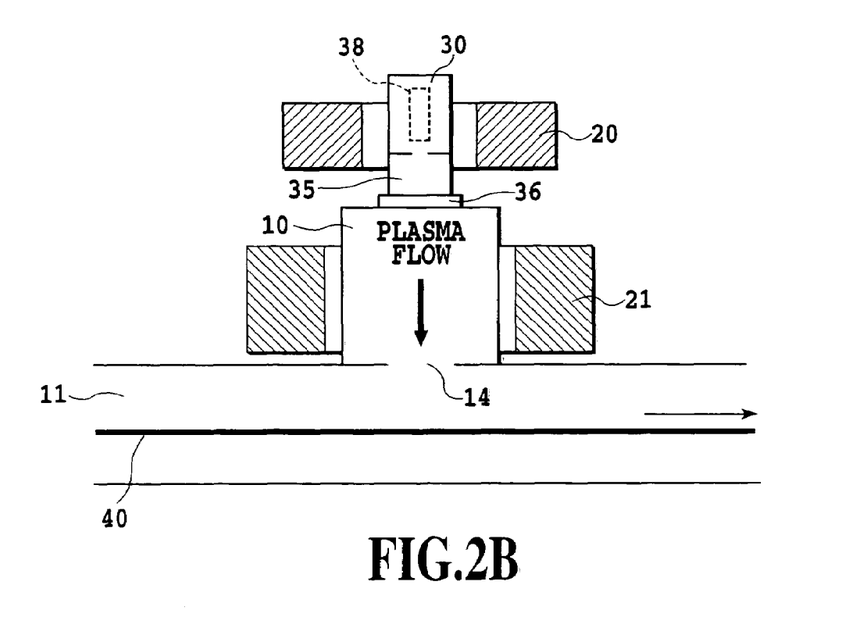
FIG. 2B is a sectional view taken along IIB-IIB' from FIG. 2A.

FIG. 2A and FIG. 2B are diagrams for explaining the construction of an ECR plasma device (e.g., an etching device or a CVD device) comprising the ECR plasma source thus constructed. FIG. 2A is a top plan view of the device, and FIG. 2B is a sectional view taken along IIB-IIB' from FIG. 2A. The basic construction is similar to that of the ECR plasma device shown in FIG. 1A and 1B, but the microwave introducing portion 30 of the ECR plasma source is made of a microwave cavity resonator.

The microwave introducing portion 30, as shown in those Figures, is terminated on its end face with a metal plate or the like to form the terminal end portion 31. The other end portion, which is spaced by a distance of $n \times (\lambda g/2)$ (n: an integer of 3 or more) from that terminal end portion 31, is made to form an opening 38 of the cavity resonator by inserting a metal plate slit or the like into the other end portion. In the longitudinal direction of the microwave introducing portion 30 between the terminal end portion 31 and the end portion having the opening 38 of the cavity resonator, there are alternately disposed the plural resonance units 32 and 33 (i.e., the resonance units 32 not having the opening 34 in the side face, and the resonance units 33 having the opening 33 in the side face), which are connected in series at every lengths of $\lambda g/2$ from the terminal end portion 31). This alternate disposition constructs the microwave cavity resonator.

In FIG. 2A, the dotted portions indicating the boundaries between the resonance units 32 and the resonance units 33 may be provided or not with apertures for adjusting the susceptance. This alternate structure may be suitably designed according to the specifications as the ECR plasma source or the ECR plasma device. In FIG. 2B, the openings 38 are indicated by dotted lines.

In this structure, moreover, the microwaves are transmitted from the plural openings 34, which are formed in the side faces (or in the lower faces in FIG. 2B) of the in-phase portions of the microwave cavity resonator, into the plasma generating chamber 10. In the construction example shown in FIG. 2A and FIG. 2B, the total length of the cavity resonator is 3.5 times as large as the $\lambda g$.

The three resonance units 33 having the opening 34 in the side face is located in this cavity resonator. The microwaves in these resonance units are standing waves in phase so that the in-phase microwaves are introduced from the openings 34 in the side face into the plasma generating chamber 10 through the microwave transmission portion 35 and the microwave introducing aperture 36. With this construction, the ECR plasma having the uniform plasma density can be generated at the predetermined position in the generally rectangular plasma generating chamber 10.

Second Embodiment

Figure 3A:
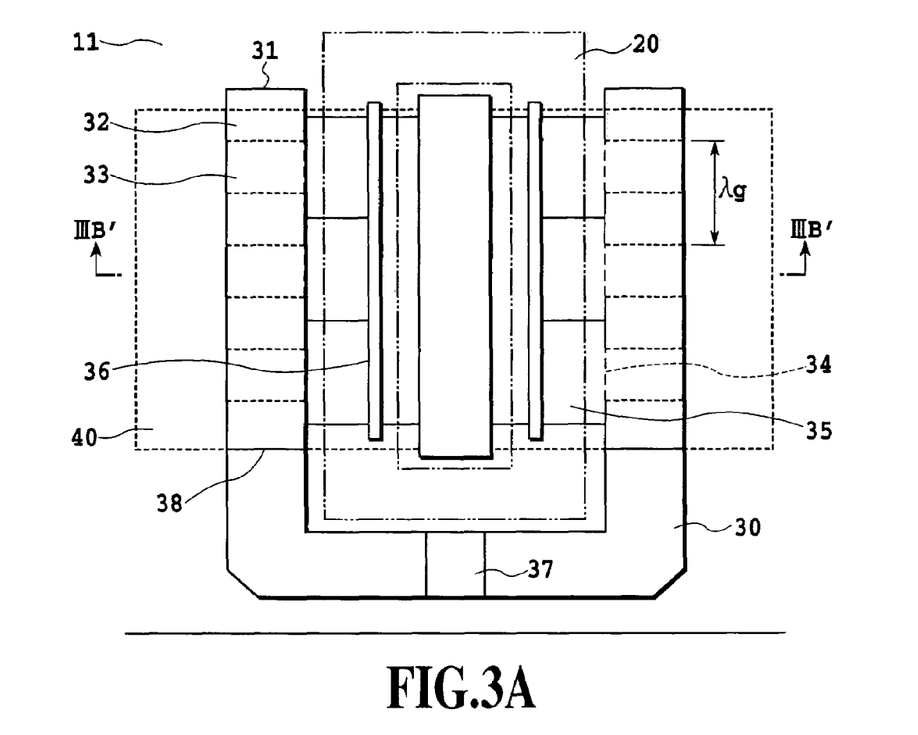
FIG. 3A is a top plan view of the sputtering device.
Figure 3B:
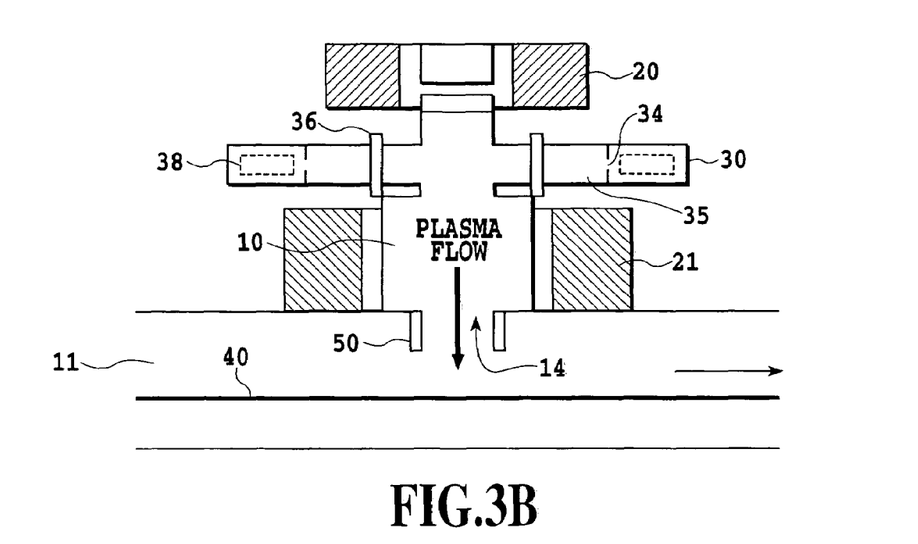
FIG. 3B is a sectional view taken along IIIB-IIIB' from FIG. 3A.

FIG. 3A and FIG. 3B are diagrams for explaining the construction of an ECR plasma source according to the second embodiment of the invention, and a sputtering device comprising the ECR plasma source. FIG. 3A is a top plan view of the sputtering device, and FIG. 3B is a sectional view taken along IIIB-IIIB' from FIG. 3A.

The basic structure of this ECR plasma source is similar to that shown in FIG. 2A and FIG. 2B, and is composed to include the plasma generating chamber 10, the magnetic coils 20 and 21, and the microwave introducing portion 30. In this construction, however, the microwave introducing portion 30 comprises a microwave branching portion 37 for branching and binding the microwaves transmitted from a microwave transmitting device.

The plasma generated in the plasma generating chamber 10 is accelerated along the magnetic lines so that it becomes a plasma flow directed to the sample chamber 11 through the plasma drawing opening 14. When a DC or RF electric power is applied to a target 50 arranged around the plasma flow, the elements such as metals or semiconductors composing the target 50 are sputtered to deposit on the sample 40 arranged in the sample chamber 11.

In order to treat the whole surface of the large-sized sample such as the FPD, this embodiment is provided with the not-shown sample moving mechanism. The sample 40 is subjected, while being moved by the sample moving mechanism in the sample chamber 11 at a predetermined speed in the direction of arrow, to a sputtering treatment so that its whole surface is deposited.

The plasma generating chamber 10 is designed to have a generally rectangular sectional shape in a plane normal to the plasma flow, so that the generally rectangular area to be irradiated with the plasma flow can be formed on the sample 40. On the other hand, the magnetic coils 20 and 21 are wound in the generally rectangular shape in a plane normal to the plasma flow so that they generate a magnetic field for the ECR conditions in the plasma generating chamber 10 at the predetermined position.

The microwaves are introduced into the plasma generating chamber 10 from the microwave introducing portion 30 using the branching and binding method through the microwave introducing aperture 36 made of quarts or the like. As a result, the electrons in the magnetic field can be efficiently accelerated by the vibrating magnetic field of the microwaves.

In the construction example shown in FIG. 3A and FIG. 3B, the microwaves, which are generated by the microwave source (utilizing the magnetron tube or the like), are transmitted to the microwave branching portion 37 through the isolator, the matching device or the like. The microwaves are branched by the microwave branching portion 37 into two left and right directions so that the branched microwaves are introduced into the cavity resonators arranged on the individual sides.

In each cavity resonator, as has been described with reference to FIG. 2A and FIG. 2B, the in-phase microwaves are introduced from the openings 34 in the side face into the plasma generating chamber 10 through the microwave transmission portion 35 and the microwave introducing aperture 36, so that the microwaves from the two sides are synthesized to propagate in the plasma generating chamber 10. With this construction, the ECR plasma having the uniform plasma density can be generated at the predetermined position in the generally rectangular plasma generating chamber 10.

Specifically, this microwave introducing portion 30 has the terminal end portions 31 at its end faces. In the individual left and right longitudinal directions of the microwave introducing portion 30, the plural resonance units are connected in series at every intervals of $\lambda g/2$ ($\lambda g$: the guide wavelength) from the terminal ends 31 thereby to construct the microwave cavity resonators. In this structure, the microwaves are transmitted into the plasma generating chamber 10 from the plural openings 34 which are formed in the side faces (i.e., the left face or the right face in FIG. 3B) of the in-phase portions of those microwave cavity resonators. In the construction example shown in FIG. 3A and FIG. 3B, the left and right cavity resonators have the individual total length of 3.5 times as large as $\lambda g$.

The metal plate slits or the like are inserted into the end portions of the individual left and right cavity resonators thereby to form the openings 38. The resonance unit 32 not having the opening 34 in the side face and the resonance units 33 having the opening 34 are alternately arranged sequentially from the terminal portions 31.

This example is provided with individually three resonance units 33 having the opening 34 in the side face. The microwaves in these resonance units 33 are standing waves in phase so that the in-phase microwaves are transmitted from the openings 34 in the side face to the microwave transmission portion 35. Moreover, the microwaves transmitted through the left and right microwave transmission portions 35 are introduced through the microwave introducing apertures 36 into the plasma generating chamber 10 so that they are synthesized. With this construction, the ECR plasma having the uniform plasma density can be generated at the predetermined position in the generally rectangular plasma generating chamber 10.

By this branching and binding method, the microwave introducing apertures can be prevented from being contaminated, even in the sputtering of the large-sized sample. It is needless to say that the ECR plasma source of the branching and binding type shown in FIG. 3A and FIG. 3B can also be used in the etching device or the CVD device.

In the construction example disclosed herein, the left and right cavity resonators have their individual total length of 3.5 times as large as $\lambda g$. It is, however, needless to say that the total length of the cavity resonators can be freely set according to the size of the sample to be treated.

Figure 4:
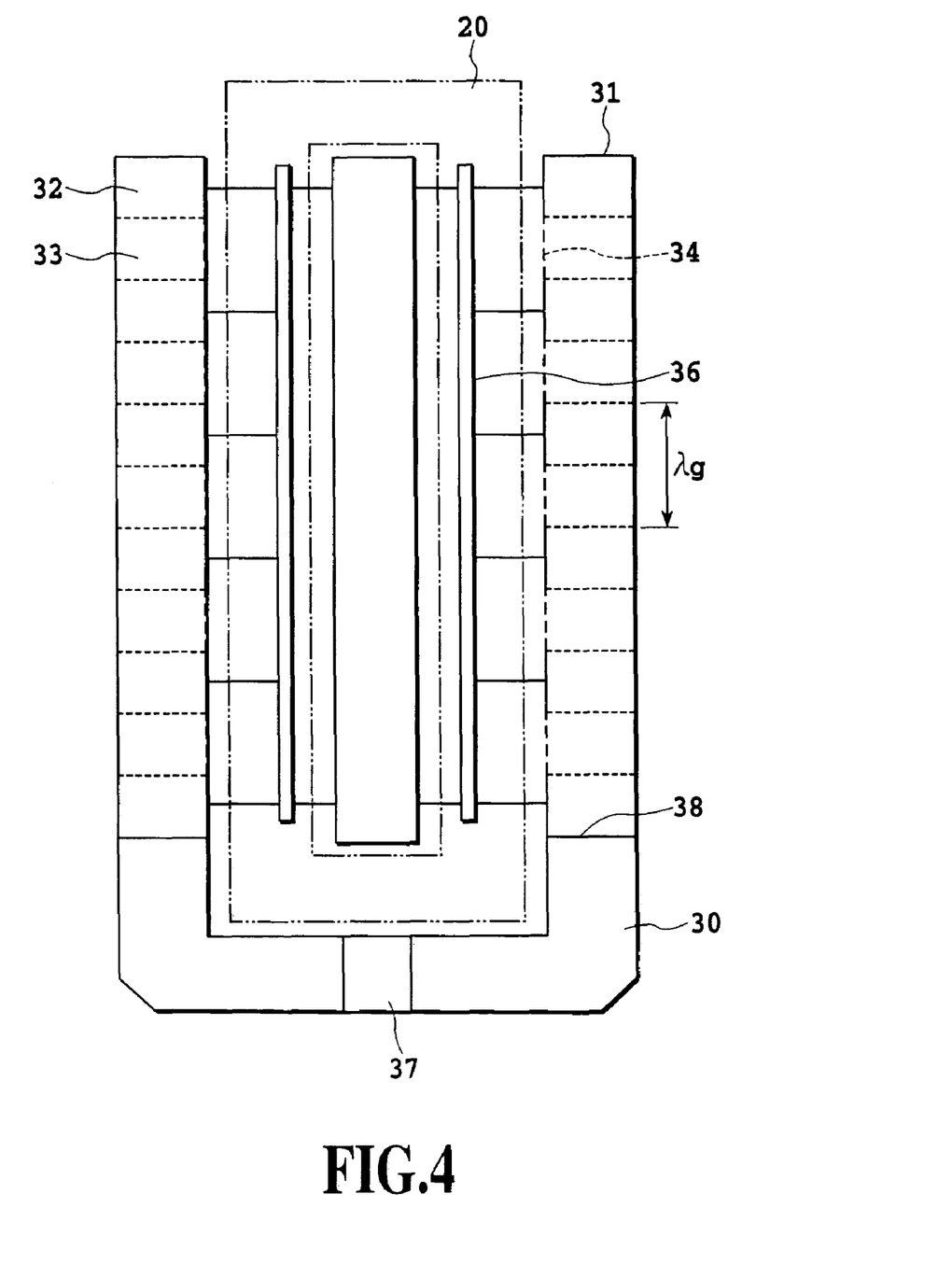
FIG. 4 is a top plan view for explaining a fourth example of the construction of the ECR plasma source of the invention.

For example, the ECR plasma source of the construction shown in FIG. 4 is the plasma source of the branching and binding type similar to the ECR plasma source which is comprised by the sputtering device shown in FIG. 3A and FIG. 3B. The individual left and right resonators have a length of 5.5 times as large as $\lambda g$, so that the ECR plasma source can treat a generally rectangular sample, which has a width of about 1.6 times as large as that of the ECR plasma source comprised by the sputtering device shown in FIG. 3A and FIG. 3B. Even if the longer sides of the generally rectangular section thus changes, the generally rectangular section of a size according to the purpose can be formed by adjusting the number of the resonance units having the length of $\lambda g/2$.

It is also needless to say that the numbers of turns and the current values of the magnetic coils 20 and 21 may be designed to generate the magnetic fields for the ECR conditions at the predetermined position of the plasma generating chamber 10, and that one or more magnetic coils can be used.

Thus in the sputtering device having the construction shown in FIG. 3A and FIG. 3B, the film of $SiO_2$, $Si_3N_4$, $Al_2O_3$, AlN or the like can be easily formed by introducing a gas of $O_2$, $N_2$ or the like from the not-shown gas introduction port into the plasma generating chamber 10 and by sputtering the target 50 of Si, Al or the like. Moreover, the thin film can be uniformly formed all over the sample of a large area by sputtering the large-sized sample while moving it at a predetermined speed.

According to the invention, as has been described hereinbefore, the ECR plasma source comprises: the plasma generating chamber having the generally rectangular section in the plane normal to the plasma flow; the magnetic coils wound in the generally rectangular shape in the plane normal to the plasma flow; and either the waveguide having the terminated end portion or the microwave cavity resonator including the plural resonance units having the terminated end portion and connected in series. The in-phase microwaves are transmitted into the plasma generating chamber from the plural openings which are formed in the in-phase side faces of the waveguide or the microwave cavity resonator. It is, therefore, possible to provide the ECR plasma source which can generate the plasma density uniform in the generally rectangular section.

According to the invention, moreover, the microwave introducing portion of the ECR plasma source is made of the structure, in which the microwaves transmitted from the microwave transmitting tube are branched and bound. Therefore, the treatment such as the sputtering can be executed without any contamination in the microwave introducing aperture.

According to the invention, still moreover, the ECR plasma device comprises not only the aforementioned ECR plasma source as the plasma source but also the sample moving mechanism for moving the large-sized sample. It is possible to provide the ECR plasma device which can sputter or etch even the large-sized sample of the generally rectangular shape such as the FPD easily.

What is claimed is:

1. An ECR plasma source comprising:
   a microwave source;
   a microwave introducing means connected to the microwave source;
   a microwave transmitting means connected to the microwave introducing means;

a plasma generating chamber connected to the microwave transmitting means; and at least one magnetic generation means having magnetic coils wound around the plasma generating chamber for generating the electron cyclotron resonance (ECR) plasma and a plasma flow drawn from an opening of the plasma generating chamber, wherein, the plasma generating chamber has generally rectangular sectional shapes, the magnetic coils of the magnetic generation means are wound in generally rectangular shapes normal to the direction of the plasma flow, the microwave introducing means includes a straight shape microwave cavity resonator which is terminated on one end portion of the straight shape microwave cavity resonator with a metal plate to form a terminal end portion having no opening, the other end portion of the straight shape microwave cavity resonator having a first opening formed by inserting a metal plate slit into the other end portion, the end portion having the first opening is connected to the microwave source through a part of the microwave introducing means, the straight shape microwave cavity resonator has a terminal end portion having no opening and an end portion having the first opening disposed at a distance of $n \times (\lambda g/2)$ (n: an integer of 3 or more, $\lambda g$: guide wavelength) from the terminal end portion, and in the straight shape microwave cavity resonator, first resonance units having a length $\lambda g/2$, but not having openings in a side, and second resonance units having a length of $\lambda g/2$ and having at least one second opening in a side, are alternately arranged sequentially from the terminal end portion, two or more second resonance units being disposed in the straight shape microwave cavity resonator, and microwaves in phase from the second openings are introduced into the plasma chamber through the microwave transmitting means.

2. An ECR plasma source as claimed in claim 1, wherein the microwave introducing means includes microwave branching means for branching and binding the microwaves transmitted from the microwave transmitting means.

3. An ECR plasma apparatus comprising the ECR plasma source as claimed in claim 2.

4. An ECR plasma apparatus as claimed in claim 3, comprising sample moving means; wherein a sample is irradiated at a generally rectangular area of a surface of the sample while being moved by the sample moving means.

5. An ECR plasma apparatus comprising the ECR plasma source as claimed in claim 1.

6. An ECR plasma apparatus as claimed in claim 5, comprising sample moving means; wherein a sample is irradiated at a generally rectangular area of a surface of the sample while being moved by the sample moving means.

7. An ECR plasma source as claimed in claim 1, wherein an opening is formed between the first resonance unit and the second resonance unit.

* * * * *